United States Patent
Asbridge et al.

(10) Patent No.: US 12,181,992 B1
(45) Date of Patent: Dec. 31, 2024

(54) INTELLIGENT RISER TESTING DEVICE AND METHODS

(71) Applicant: SANBlaze Technology, Inc., Littleton, MA (US)

(72) Inventors: B. Vincent Asbridge, Rockport, MA (US); Ulf Frisk, Stockholm (SE)

(73) Assignee: SANBlaze Technology, Inc., Littleton, MA (US)

(*) Notice: Subject to any disclaimer, the term of this patent is extended or adjusted under 35 U.S.C. 154(b) by 316 days.

(21) Appl. No.: 17/963,334

(22) Filed: Oct. 11, 2022

Related U.S. Application Data

(60) Provisional application No. 63/254,320, filed on Oct. 11, 2021.

(51) Int. Cl.
| | |
|---|---|
| *G06F 11/00* | (2006.01) |
| *G01R 31/317* | (2006.01) |
| *G06F 1/26* | (2006.01) |
| *G06F 11/263* | (2006.01) |

(52) U.S. Cl.
CPC ...... *G06F 11/263* (2013.01); *G01R 31/31726* (2013.01); *G06F 1/266* (2013.01)

(58) Field of Classification Search
CPC ........ G06F 11/263; G06F 11/26; G06F 11/25; G06F 11/24; G06F 11/261; G06F 11/2635; G06F 1/266; G01R 31/31726
See application file for complete search history.

(56) References Cited

U.S. PATENT DOCUMENTS

| | | | |
|---|---|---|---|
| 6,324,485 B1 * | 11/2001 | Ellis | G11C 29/56 702/108 |
| 10,114,658 B2 | 10/2018 | Huang et al. | |
| 10,990,157 B2 * | 4/2021 | Chang | G06F 1/3253 |
| 12,079,097 B2 * | 9/2024 | Khare | G06F 11/2268 |
| 2007/0218709 A1 * | 9/2007 | Yang | H05K 1/147 439/61 |
| 2015/0301109 A1 * | 10/2015 | O'Flynn | G01R 31/3191 324/750.02 |

(Continued)

FOREIGN PATENT DOCUMENTS

| | | |
|---|---|---|
| CN | 102043748 B | 10/2012 |
| CN | 106452968 A | 2/2017 |

(Continued)

*Primary Examiner* — Joseph D Manoskey
(74) *Attorney, Agent, or Firm* — Clocktower Law LLC; Erik J Heels; Michael A Bartley

(57) ABSTRACT

A solution is the iRiser. The iRiser is a PCIe riser, designed to work with SANBlaze test systems but capable of operation in any PCIe slot on any computer. The iRiser includes a dedicated ASIC or programmed FPGA that cycles any of 32 signals, including power and reset, and samples power at up to 1 million samples per second, to any connected PCIe devices (such as sixteen NVMe drives under test in a SANBlaze test system, or more if larger testing systems are used). This allows precise insertion of any signal, including power and reset, at any desired testing point, and precise measurement of power drawn during any test condition, including transitions such as power on/off, reset, and low power state returning to running state. The iRiser can write measurement data to a host controller through direct memory access, providing the data synchronized to precise test conditions with zero overhead.

11 Claims, 6 Drawing Sheets

(56) References Cited

U.S. PATENT DOCUMENTS

2015/0378415 A1    12/2015  George
2021/0405108 A1*   12/2021  Strickling .......... G01R 31/2808

FOREIGN PATENT DOCUMENTS

| CN | 108052423 A  | 5/2018  |
|----|--------------|---------|
| CN | 106649021 B  | 4/2019  |
| CN | 110297735 A  | 10/2019 |
| CN | 110874293 A  | 3/2020  |
| CN | 111447121 A  | 7/2020  |
| CN | 211505789 U  | 9/2020  |
| CN | 108984453 B  | 2/2021  |
| CN | 212749161 U  | 3/2021  |
| WO | 2020207040 A1| 10/2020 |

* cited by examiner

ND METHODS

CROSS-REFERENCE TO RELATED APPLICATIONS

This utility patent application claims priority from U.S. provisional patent application Ser. No. 63/254,320, filed Oct. 11, 2021, titled "Intelligent Riser Testing Device and Methods", naming inventors B. Vincent Asbridge and Ulf Frisk.

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. Copyright 2022, SANBlaze Technology, Inc.

BACKGROUND

Field of Technology

This relates to computer testing devices, and more specifically to monitoring power load of PCIe devices under test.

Background

SANBlaze produces SSD drive validation test systems, capable of simultaneously testing 16 NVMe drives. Current SANBlaze test systems measure power drawn by each device under test once per second. A higher granularity measurement is needed for precise monitoring during specific test conditions.

Existing solutions use FPGA boards to test SSD drives. They simultaneously test many drives, and push host processor performance to maximize testing capabilities. The existing solutions are capable of controlling power and reset testing, but are currently limited on the granularity of such testing due to processing limitations.

The existing solutions are also dedicated to testing SSD drives, and not directly expandable to test other similarly connectable devices.

What is needed, therefore, is a system and method that can simultaneously test multiple connected PCIe devices, precisely control signals including power and reset to those devices, and monitor power to each device under test in a way that is precisely synchronized with the test without adding overhead on a host processor of the testing device.

BRIEF SUMMARY

A solution is the iRiser. The iRiser is a PCIe riser, designed to work with SANBlaze test systems but capable of operation in any PCIe slot on any computer. The iRiser includes either a dedicated ASIC or programmed FPGA that cycles any of 32 signals, including power and reset, and samples power at up to 1 million samples per second, to any connected PCIe devices (such as sixteen NVMe drives under test in a SANBlaze test system, or more if larger testing systems are used). This allows precise insertion of any signal, including power and reset, at any desired testing point, and precise measurement of power drawn during any test condition, including transitions such as power on/off, reset, and low power state returning to running state. Further, the iRiser can write measurement data to a host controller through direct memory access, providing the data synchronized to precise test conditions with zero overhead.

BRIEF DESCRIPTION OF THE DRAWINGS

In the drawings, closely related figures and items have the same number but different alphabetic suffixes. Processes, states, statuses, and databases are named for their respective functions.

DETAILED DESCRIPTION, INCLUDING THE PREFERRED EMBODIMENT

In the following detailed description, reference is made to the accompanying drawings which form a part hereof, and in which are shown, by way of illustration, specific embodiments which may be practiced. It is to be understood that other embodiments may be used, and structural changes may be made without departing from the scope of the present disclosure.

Operation

Figure 1:
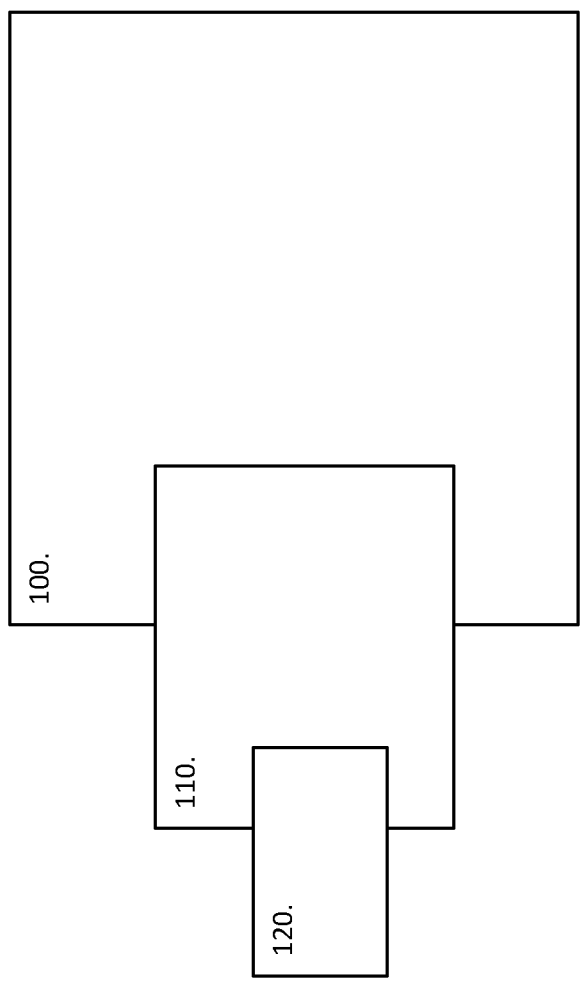
FIG. 1 is a block diagram of a connected host system with an iRiser.
Figure 2:
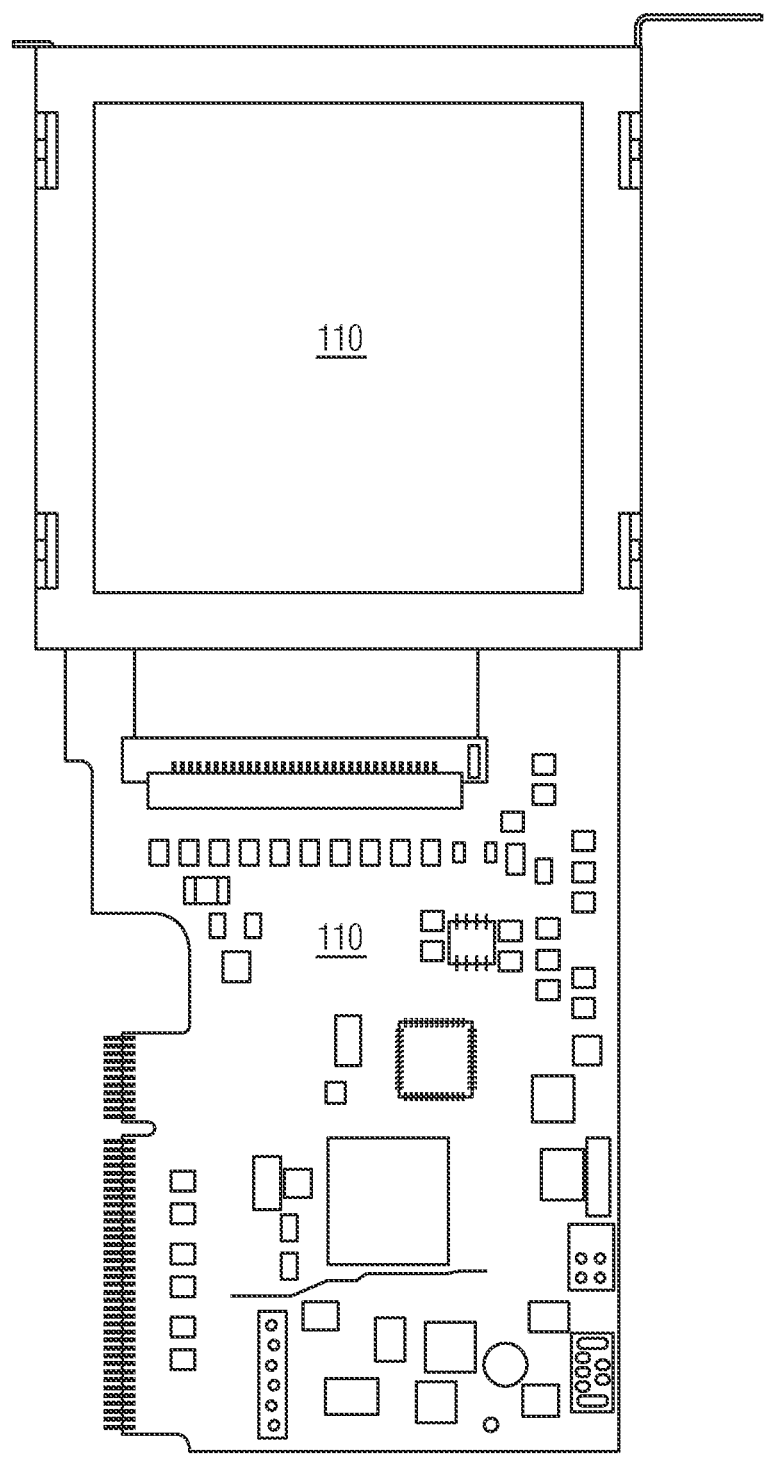
FIG. 2 is a drawing of a disconnected iRiser.
Figure 3:
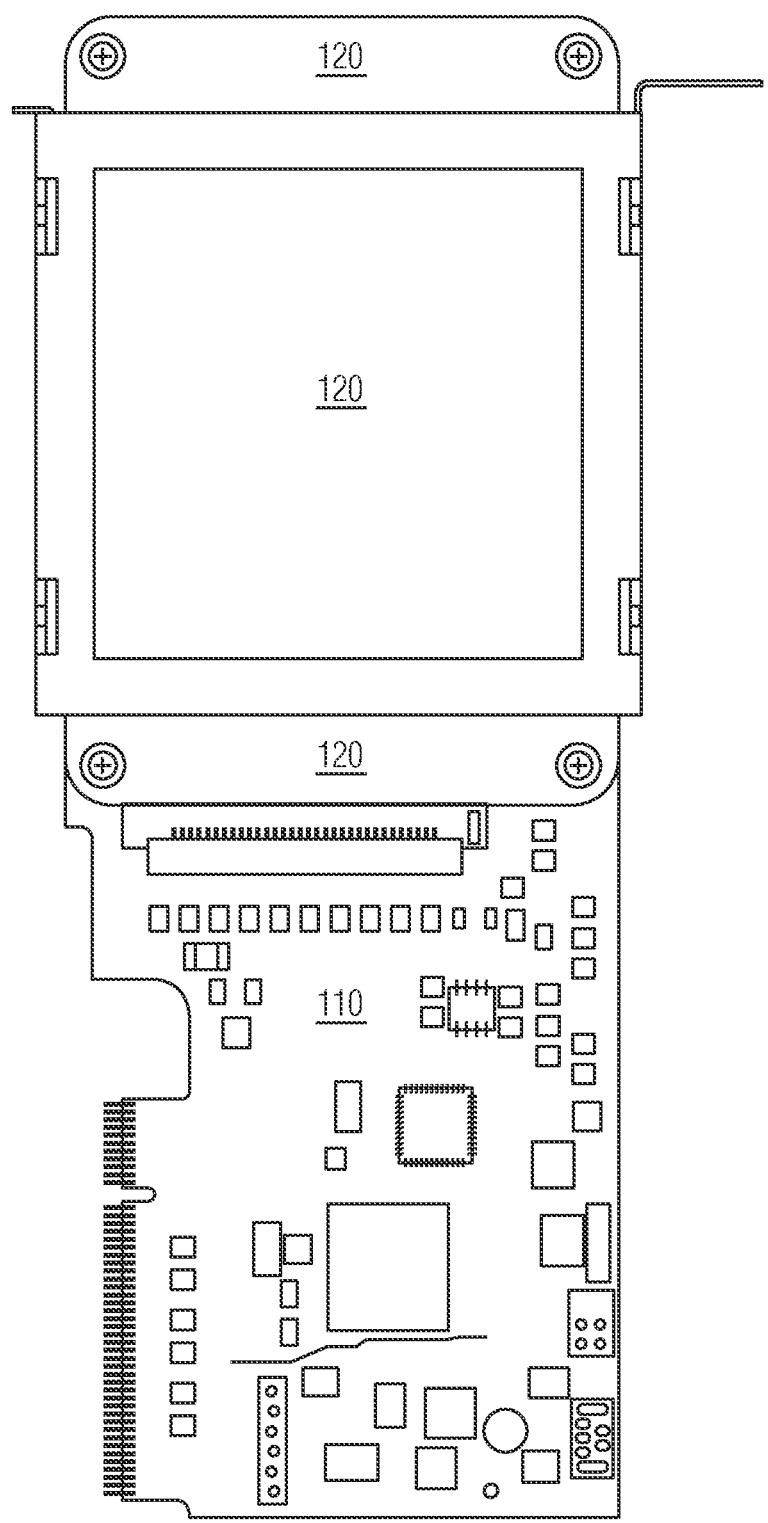
FIG. 3 is a drawing of an iRiser with SSD drive connected.

Existing SANBlaze systems, such as the SANBlaze SBExpress-RM4, are dedicated systems for rapid high-scale simultaneous testing of multiple peripheral component interconnect express (PCIe) solid state drives (SSDs). These systems utilize internal field-programmable gate array (FPGA) cards, such as cards with the Xilinx 7 Series FPGA, configured for specific device testing. The solutions discussed herein may be implemented on these same FPGA cards to provide enhance testing capabilities, on different FPGA cards dedicated to testing different PCIe devices, on a PCIe riser card which may be added into the same test systems, or on a PCIe riser card which connects as an interposer into any PCIe slot on a computer motherboard, and into which a PCIe device or another PCIe card may connect, extending the testing capabilities to any PCIe device. Alternative to the FPGA cards, the same functionality may be implemented in a dedicate application specific integrated circuit (ASIC) card. The examples and discussion herein focus on a preferred embodiment through the PCIe riser (hereinafter referred to as the "card"), but the functionality remains the same across all possible cards. Referring to FIGS. 1-3, in the preferred embodiment host system 100 is a test system configured to test PCIe devices. Card 110 connects to host system 100, and in turn device under test 120 connects to card 110.

In order to control different signals to the device under test, different general purpose input/output (GPIO) pins are configured. Each pin may control a different signal, including power and reset signals to the device under test. One example configuration may include 32 GPIO pins as in Table 1:

TABLE 1

| GPIO # | GPIO Name |
| --- | --- |
| 0 | PERST port 0 |
| 1 | PERST port 1 |
| 2 | Disable 12 V |
| 3 | Enable refclk port 0 |
| 4 | Enable refclk port 1 |
| 5 | Serial Hot Plug Button port 0 |
| 6 | Serial Hot Plug Button port 1 |
| 7 | Power Disable to Drive |
| 8 | Port 0 present |
| 9 | Port 1 Present |
| 10 | Hold low to enable dual port |
| 11 | To drive connector pin 1 |
| 12 | To drive connector pin2 |
| 13 | Force present disable port 0 |
| 14 | Force present disable port 1 |
| 15 | Hold low to reset mi i2c |
| 16 | User_GPIO0 Pin1 User Connector |
| 17 | User_GPIO1 Pin2 User Connector |
| 18 | User_GPIO2 Pin3 User Connector |
| 19 | User_GPIO3 Pin5 User Connector |
| 20 | User_GPIO4 Pin6 User Connector |
| 21 | Front RED LED Lower |
| 22 | Front RED LED Upper |
| 24 | Enable slot to pex lane 0 |
| 25 | Enable slot to pex lane 1 |
| 26 | Enable slot to pex lane 2 |
| 27 | Enable slot to pex lane 3 |
| 28 | Enable pex to slot lane 0 |
| 29 | Enable pex to slot lane 1 |
| 30 | Enable pex to slot lane 2 |
| 31 | Enable pex to slot lane 3 |

The GPIO pins may be toggled between input and output. When in output mode, the value in each pin controls a specific signal to the device under test.

Figure 4:
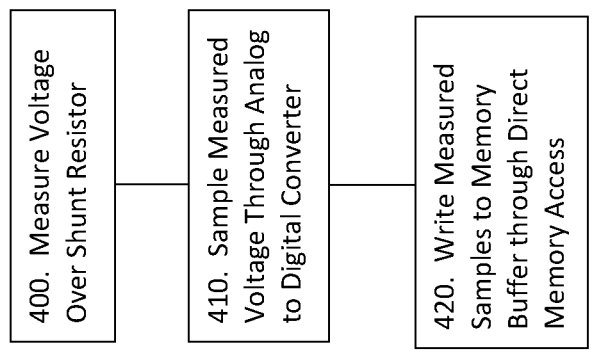
FIG. 4 is a flowchart of the process measuring power to a device under test and writing the measurements to host memory.

Referring also to FIG. 4, power to each device under test may be measured 400 by an analog to digital (AtoD) converter (ADC) measuring voltage over a precision shunt resistor. With card clock speeds of 100 MHz or greater and current ADCs, this enables sampling 410 power at up to one million samples per second, with potential for faster sampling with further hardware development. To get this data to the host processor, the card may be configured to write 420 the ADC power samples into a dedicated physical memory buffer on the host system via direct memory access (DMA) writes. Memory registers on the card may be configured to store configuration for the host memory buffer, for example through a 64-bit base address, a 32-bit current offset, and a 32-bit buffer size as detailed in Table 2:

TABLE 2

| Register | Purpose |
| --- | --- |
| 0x220-0x227 | DMA physical base address |
| 0x228-0x22b | DMA current byte offset |
| 0x22c-0x22f | DMA buffer max byte size |

Each sample stored in the host system physical memory is 16-bytes long and logged into a 16-byte boundary. Different formats may be used, with a preferred format including a type identifier (indicating it is an ADC sample), followed by a wrap count (the number of times the writes to the memory buffer have wrapped around, if enabled), followed by the data (the ADC value), followed by a timestamp (the number of clock ticks since the card was booted). This format is illustrated in Table 3:

TABLE 3

| | |
| --- | --- |
| 0x0-0x0 | TYPE (0x80 for ADC sample) |
| 0x1-0x1 | WRAP COUNT (# of times the writes to memory buffer have wrapped around, if enabled) |
| 0x2-0x3 | NOT USED |
| 0x4-0x7 | DATA (ADC value, little endian) |
| 0x8-0xf | TIMESTAMP (number of clock ticks since device was booted, little endian) |

Figure 5:
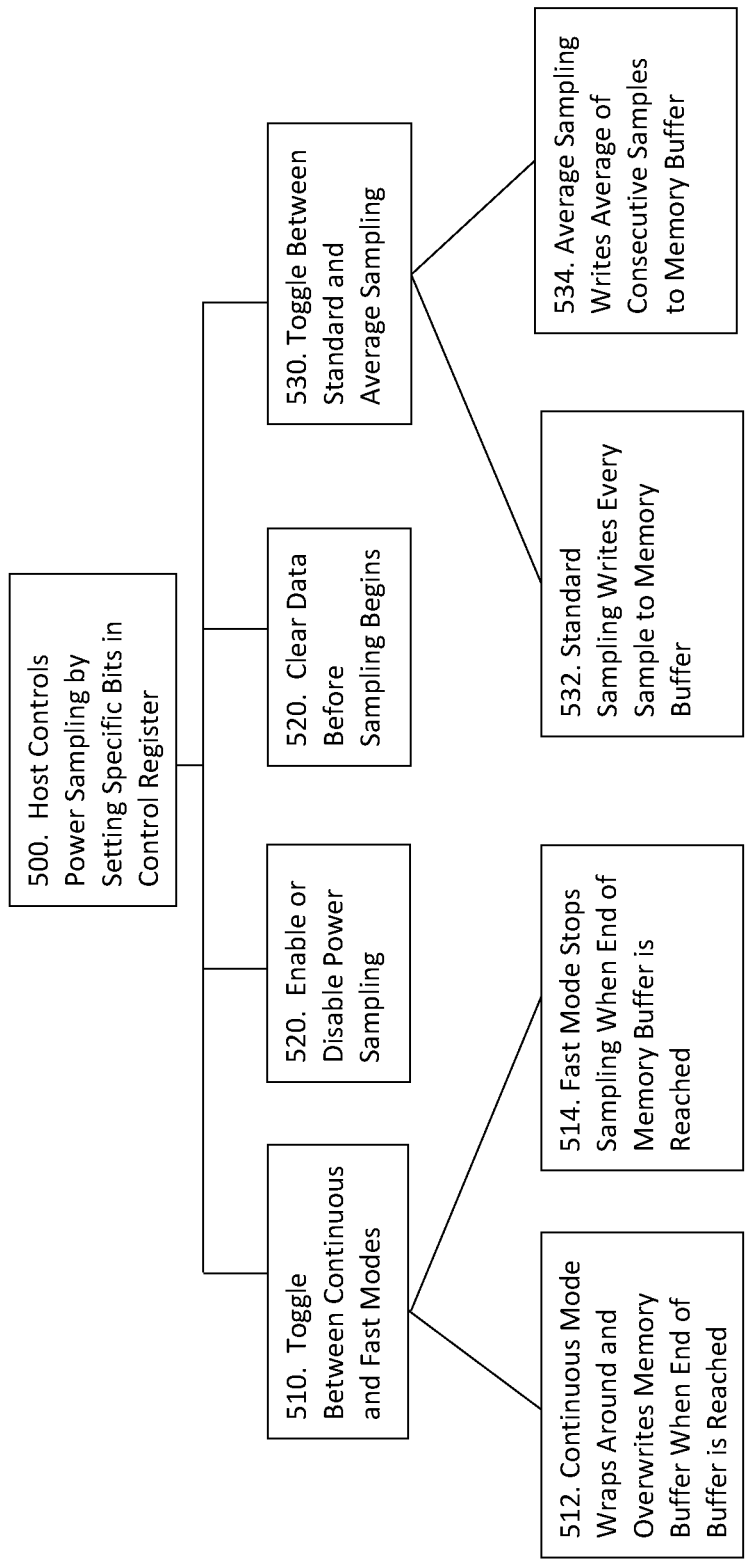
FIG. 5 is a flowchart illustrating controlling power sampling.

With the power data written to host memory via DMA, it is available to the host processor without any increase in processing burden on the host processor. To be useful, the data needs to be connected to the specific tests applied to the device under test. Referring also to FIG. 5, this is accomplished through control 500 of the power data sampling and synchronization with specific testing.

The power sample writing to host memory may be toggled 510 between two different modes. In continuous mode, the power samples are continuously written to host physical memory through DMA, and when the end of the allocated memory buffer is reached the sample writing wraps 512 back to the beginning of the buffer. As long as the host system reads the data from the buffer in intervals shorter than the time to fill the buffer, no power data is lost. In fast mode, samples are written into the memory buffer, and power sampling stops 514 once the buffer is full. This mode may be preferable when sampling around specific testing events. A specific register on the card may be dedicated to controlling power sampling, where bits may be set by the host system to enable or disable 520 power sampling, set specific mode 510, set to clear 530 the sample data, and to toggle between standard and average sampling 530. The clear data bit is preferably set 520 before data sampling begins (or resets), to clear data and start writing at the beginning of the memory buffer. Standard sampling mode may write every ADC sample, while average sampling may average consecutive samples on the card, and write that average sample to the host memory buffer. An example ADC state machine control register is detailed in Table 4:

TABLE 4

| Bit | Purpose |
| --- | --- |
| 1 | 0: Disabled<br>1: Enabled |
| 2-4 | Not Used |
| 5 | SAMPLE MAX<br>0: STOP<br>1: WRAP AROUND |
| 6 | SAMPLE MODE<br>0: STANDARD<br>1: AVERAGE |
| 7 | 1: SAMPLE CLEAR |

Figure 6:
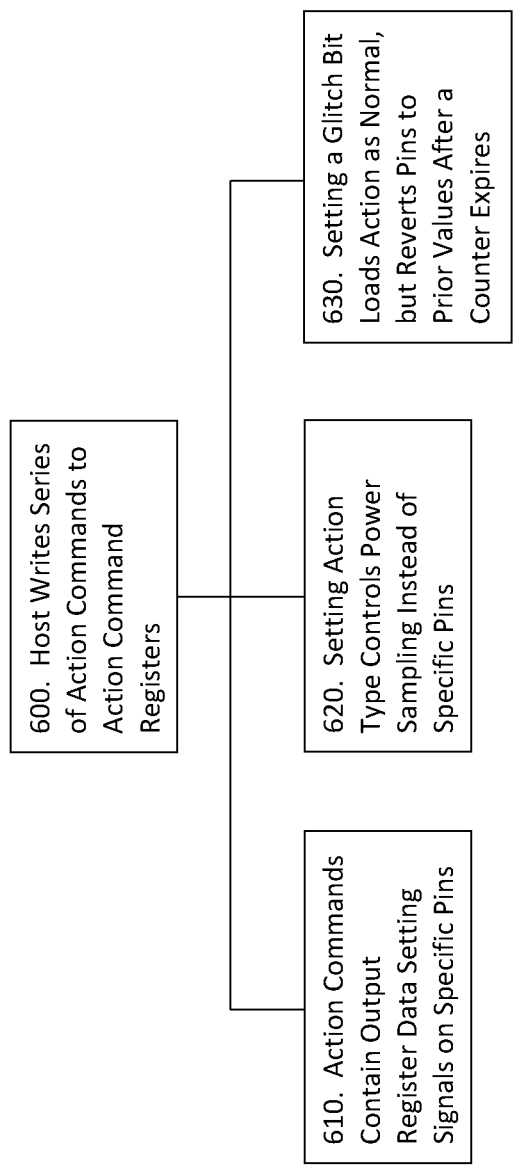
FIG. 6 is a flowchart of a host controlling the iRiser with action commands.

Referring also to FIG. 6, The sample data may be synchronized with testing through action commands performed by the card. For example, the ADC control register may be followed by a register holding a current action, and another register holding a next action. The action values may be written 600 directly into the action command registers by the host system, or may be written into RAM or series of registers on the card for sequential insertion into the action command registers. For example, 0x800-0xfff may be reserved as 128 "slots" holding 128-bit/16-byte action values. Each action value may be 16 bytes long, and may contain 610 output register data, direction register data, a counter before next action, a save slot number for input register value and next action slot number. An example action register is detailed in Table 5:

TABLE 5

| | |
|---|---|
| 0x0-0x3 | OUTPUT registers (GPIO output value if direction register indicates output) |
| 0x4-0x7 | DIRECTION register (direction of GPIO PIN, 0 = IN, 1 = OUT) |
| 0x8-0xD | COUNTER register (number of clock ticks before next action) |
| 0xE | READ # (read slot to write value of INPUT register into when loaded as active) |
| 0xF | ACTION # (upper bit = stop bit; lower 7 bits = action slot of next action) |

Finer integration control may be achieved by adding 620 a type to specific actions, and allowing different action types to control the power sampling through controlling the ADC as an alternative to controlling the GPIO pins. In this case, a "type" may modify how an action value is processed, with an example of such detailed in Table 6:

TABLE 6

| | |
|---|---|
| 0x0-0x3 | TYPE DEPENDENT REGISTER:<br>TYPE 0: OUTPUT registers (GPIO output value if direction register indicates output)<br>TYPE 1: ADC Timer Next Read (in number of samples) |
| 0x4-0x7 | TYPE DEPENDENT REGISTER:<br>TYPE 0: DIRECTION register (direction of GPIO PIN, 0 = IN, 1 = OUT)<br>TYPE 1: Not Used |
| 0x8-0xC | COUNTER register (number of clock ticks before next action) |
| 0xD | 0 = GPIO<br>1 = ADC START<br>2 = ADC STOP |
| 0xE | GPIO SAMPLE WRITE:<br>0 = DISABLE<br>1 = ENABLE |
| 0xF | ACTION # (upper bit = stop bit; lower 7 bits = action slot of next action) |

This fully integrates starting and stopping power sampling in between specific testing actions on any of the signals controlled by the GPIO pins. Test actions may be further enhanced by configuration 630 of a "glitch" bit, which may be the top bit in the counter register. With the glitch bit set, the action is loaded as normal, but when the counter expires the value on the GPIO pins reverts to their prior values from before the "glitch" action was loaded, and then the next action is loaded as normal. This allows inserting specific signal glitches at any point of any test program.

It is to be understood that the above description is intended to be illustrative, and not restrictive. Many other embodiments will be apparent to those of skill in the art upon reviewing the above description. The scope should, therefore, be determined with reference to the appended claims, along with the full scope of equivalents to which such claims are entitled.

What is claimed is:

1. A method for device testing, comprising:
inserting a riser card into a host system between the host system and a device under test, wherein the device under test is connected through a peripheral component interconnect express (PCIe) connection;
controlling, by the riser card, a plurality of signals to the device under test, including power and reset signals, by turning on or off one or more general purpose input output pins on the riser card;
programmatically cycling, by the riser card, any of the plurality of signals to the device under test;
sampling, by the riser card, power to the device under test at up to one million samples per second by measuring voltage over a precision shunt resistor and processing through an analog to digital converter;
writing, by the riser card, the sampled power to host memory through direct memory access (DMA) such that the sampled power is accessible by the host system in synchronization with a specific test;
controlling power sampling by the host system setting specific bits into a control register of the riser card, including:
setting one bit in the control register that clears a specific memory buffer in host memory into which sampled power is written;
setting a second bit in the control register to select either continuous or fast mode, wherein both continuous and fast mode write into the specific memory buffer in host memory, and when an end of the buffer is reached: continuous mode wraps to a beginning of the buffer and continuous writing power samples into the buffer, while fast mode stops power sampling;
setting a third bit in the control register to select either normal or average sampling, wherein normal sampling writes every sample to memory buffer, while average sampling writes an average of consecutive samples to memory buffer; and
setting a fourth bit in the control register that enables or disables power sampling;
the host controlling tests by writing action commands to one or more action command registers or random access memory (RAM) on the riser card and specifying, within each action command:
specific pins to enable or disable signals sent from riser card to the device under test,
a counter specifying clock ticks until a next action, and
an address of a next action to perform; and
specifying a type in one of the action commands to control power sampling, including stop and start, instead of controlling specific pins.

2. A method for device testing, comprising:
inserting a riser card into a host system between the host system and a device under test, wherein the device under test is connected through a peripheral component interconnect express (PCIe) connection;
controlling, by the riser card, a plurality of signals to the device under test including power and reset signals;
programmatically cycling, by the riser card, any of the plurality of signals to the device under test;
sampling, by the riser card, power to the device under test at up to one million samples per second by measuring voltage over a precision shunt resistor and processing through an analog to digital converter;
writing, by the riser card, the sampled power to host memory through direct memory access (DMA) such that the sampled power is accessible by the host system in synchronization with a specific test; and
controlling power sampling by the host system setting specific bits into a control register of the riser card.

3. The method of claim 2, further comprising the host system setting a bit in the control register that clears a specific memory buffer in host memory into which sampled power is written.

4. The method of claim 3, further comprising the host system setting a bit in the control register to select either continuous or fast mode, wherein both continuous and fast mode write into the specific memory buffer in host memory, and when an end of the buffer is reached: continuous mode wraps to a beginning of the buffer and continuous writing power samples into the buffer, while fast mode stops power sampling.

5. The method of claim 3, further comprising the host system setting a bit in the control register to select either normal or average sampling, wherein normal sampling writes every sample to memory buffer, while average sampling writes an average of consecutive samples to memory buffer.

6. The method of claim 2, further comprising the host system setting a bit in the control register that enables or disables power sampling.

7. The method of claim 2, wherein controlling the plurality of signals to the device under test further comprises turning on or off one or more general purpose input output pins on the riser card.

8. The method of claim 7, further comprising the host controlling tests by writing action commands to one or more action command registers or random access memory (RAM) on the riser card.

9. The method of claim 8, further comprising specifying, within each action command, specific pins to enable or disable signals sent from riser card to the device under test, a counter specifying clock ticks until a next action, and an address of a next action to perform.

10. The method of claim 9, further comprising specifying a type in one of the action commands to control power sampling including stop and start, instead of controlling specific pins.

11. The method of claim 10, further comprising:

the host system setting a glitch bit in one of the action commands;

detecting the glitch bit by the riser card;

loading the action as normal;

reverting signals to a prior state from before the action when the counter expires; and processing the next action.

* * * * *